(12) United States Patent
Shin et al.

(10) Patent No.: US 10,069,109 B2
(45) Date of Patent: Sep. 4, 2018

(54) ORGANIC LIGHT EMITTING DEVICE AND METHOD OF FABRICATING THE SAME

(71) Applicant: LG DISPLAY CO., LTD., Seoul (KR)

(72) Inventors: YoungHoon Shin, Paju-si (KR); SungJin Hong, Goyang-si (KR); Myungseop Kim, Goyang-si (KR); JoongSun Yoon, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/401,961

(22) Filed: Jan. 9, 2017

(65) Prior Publication Data

US 2017/0162814 A1 Jun. 8, 2017

Related U.S. Application Data

(63) Continuation of application No. 14/516,307, filed on Oct. 16, 2014, now Pat. No. 9,583,546.

(30) Foreign Application Priority Data

Oct. 16, 2013 (KR) .................. 10-2013-0123631

(51) Int. Cl.
*H01L 27/32* (2006.01)
*H01L 51/52* (2006.01)
(Continued)

(52) U.S. Cl.
CPC ...... *H01L 51/5253* (2013.01); *H01L 27/1225* (2013.01); *H01L 27/3258* (2013.01); *H01L 27/3262* (2013.01); *H01L 29/7869* (2013.01); *H01L 51/0096* (2013.01); *H01L 51/5259* (2013.01); *H01L 51/56* (2013.01)

(58) Field of Classification Search
CPC ......... H01L 2924/0002; H01L 27/1225; H01L 27/3258; H01L 2924/00; H01L 51/5246; H01L 51/56; H01L 2251/5338; H01L 27/32; H01L 27/3244; H01L 27/3281; H01L 29/41733; H01L 29/42384; H01L 29/78603
USPC ... 257/E21.078, E29.068, E51.018, 100, 43, 257/59, 104, 26
See application file for complete search history.

(56) References Cited

U.S. PATENT DOCUMENTS 8,138,673 B1* 3/2012 Wedding ............. H01J 47/02
313/567
2007/0170839 A1* 7/2007 Choi .................. C03C 8/24
313/500
(Continued)

FOREIGN PATENT DOCUMENTS

CN 102362352 A 2/2012
CN 101009307 A 8/2017
(Continued)

*Primary Examiner* — Edward Chin
(74) *Attorney, Agent, or Firm* — Dentons US LLP

(57) ABSTRACT

An organic light emitting device and a method of fabricating the same includes a first substrate; a thin film transistor (TFT) on the first substrate; a planarization layer on the TFT; an organic light emitting diode (OLED) on the planarization layer; a passivation layer on the OLED; a second substrate on the passivation; and a hydrogen capturing material between the first and the second substrates to prevent oxidation of materials forming the TFT.

9 Claims, 20 Drawing Sheets

(51) Int. Cl.
*H01L 29/786* (2006.01)
*H01L 27/12* (2006.01)
*H01L 51/00* (2006.01)
*H01L 51/56* (2006.01)

(56) References Cited

U.S. PATENT DOCUMENTS

| | | | | |
|---|---|---|---|---|
| 2011/0079777 A1* | 4/2011 | Akimoto | ............ | H01L 29/7869 257/43 |
| 2011/0114954 A1* | 5/2011 | Lee | .................... | H01L 51/5246 257/59 |
| 2012/0021250 A1* | 1/2012 | Lee | ........................ | B82Y 30/00 428/688 |
| 2012/0061671 A1* | 3/2012 | Hatano | ............... | H01L 27/1225 257/57 |
| 2013/0161684 A1* | 6/2013 | Momma | ................. | H01L 33/52 257/100 |

FOREIGN PATENT DOCUMENTS

| | | | | |
|---|---|---|---|---|
| JP | 2010231955 A | 10/2010 | | |
| JP | 2012079691 A | 4/2012 | | |
| JP | 2013175285 A | 9/2013 | | |
| TW | 201227943 A1 | 7/2012 | | |
| WO | 2006/057492 A1 | 6/2006 | | |
| WO | WO 2006057492 A1 * | 6/2006 | ......... | H01L 51/5246 |

* cited by examiner

ORGANIC LIGHT EMITTING DEVICE AND METHOD OF FABRICATING THE SAME

CROSS-REFERENCE TO RELATED APPLICATION

This application claims priority from and the benefit under 35 U.S.C. § 119(a) of Korean Patent Application No. 10-2013-0123631, filed on Oct. 16, 2013, which is incorporated by reference for all purposes as if fully set forth herein.

BACKGROUND

Field of the Disclosure

The present disclosure relates to an organic light emitting device and a method of fabricating the same.

Description of the Prior Art

An organic light emitting device emits light using an electroluminescence phenomenon in which an organic compound placed between electrodes emits light when electric current flows between the electrodes. Further, an organic light emitting display device is a device for displaying an image by controlling an amount of electric current flowing to the organic compound to adjust an amount of emitted light.

The organic light emitting display device has an advantage in that it is possible to make it light weight and thin while emitting light using a thin organic compound between the electrodes.

In the case that the organic light emitting device is driven by an oxide thin film transistor (TFT), if a characteristic of the oxide is changed due to various factors, a change in electric behavior of the transistor may cause a threshold voltage shift. If the extent of the threshold voltage shift is outside a compensation range for a circuit driving an organic light emitting panel, the threshold voltage shift may result in a stain or a deviation of luminance that may be visible on the screen.

Accordingly, the threshold voltage shift may be an important factor causing degradation of the organic light emitting display device, and may limit use of the oxide thin film transistor in driving the display device.

SUMMARY

Accordingly, this disclosure is directed to an array substrate including an organic light emitting display device that substantially obviates one or more of the problems due to limitations and disadvantages of the related art.

An object of the disclosure is to provide an organic light emitting device including a hydrogen capturing material that is capable of efficiently improving reliability of a driving TFT and display performance.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the referenced drawings.

To achieve these and other advantages and in accordance with the purpose of the disclosure, as embodied and broadly described, an organic light emitting device comprising: a first substrate; a thin film transistor (TFT) on the first substrate; a planarization layer on the TFT; an organic light emitting diode (OLED) on the planarization layer; a passivation layer on the OLED; a second substrate on the passivation; and a hydrogen capturing material between the first and the second substrates.

In another aspect, a method of fabricating an organic light emitting device comprising the steps of: preparing a first substrate; forming a thin film transistor (TFT) on the first substrate; forming a planarization layer on the TFT; forming an organic light emitting diode (OLED) on the planarization layer; forming a passivation layer on the OLED; disposing a second substrate on the passivation; and forming a hydrogen capturing material between the first and the second substrates.

It is to be understood that both the foregoing general description and the following detailed description are exemplary and explanatory and are intended to provide further explanation of the disclosure as claimed.

DETAILED DESCRIPTION

Figure 1:
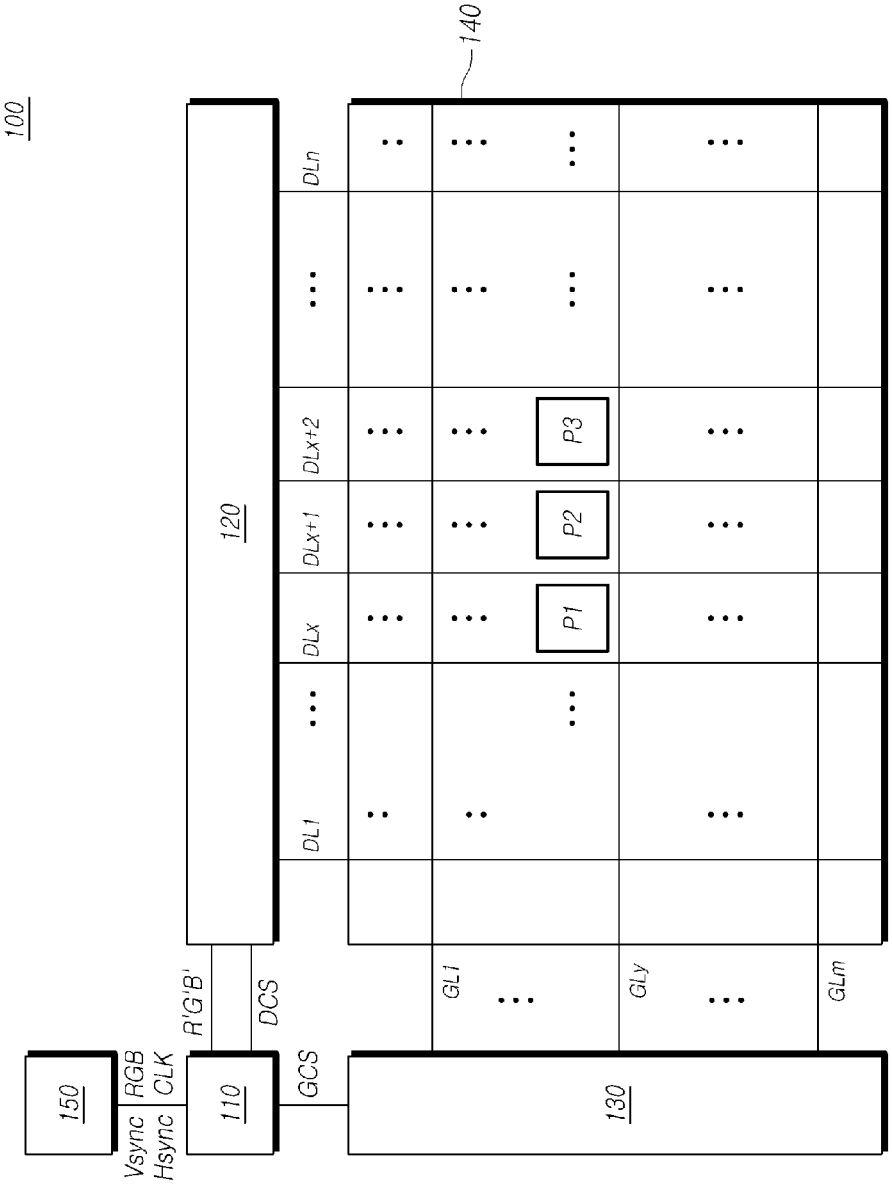
FIG. 1 is a view illustrating a system configuration of an organic light emitting display device to which exemplary embodiments may be applied.

Hereinafter, a few embodiments of the present invention will be described with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present invention rather unclear.

In addition, terms, such as first, second, A, B, (a), (b) or the like may be used herein when describing components of the present disclosure. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a view illustrating a system configuration of an organic light emitting display device to which exemplary embodiments may be applied.

Referring to FIG. 1, the organic light emitting display device 100 may include a timing controller 110, a data driving unit 120, a gate driving unit 130, a display panel 140, and a graphics controller 150.

Referring to FIG. 1, a pixel P is defined at each region on a first substrate, at which data lines DL1, DL2, . . . , DLn extending in one direction cross with gate lines GL1, GL2, . . . , GLn extending in a perpendicular direction.

Each pixel P on the display panel 140 may include at least one organic light emitting device including an anode as a first electrode, a cathode as a second electrode, and an organic light emitting layer. Each organic light emitting device in the pixel P may include at least one organic light emitting layer among red, green, blue, and white light organic emitting layers, or a white light organic emitting layer.

Each pixel P has a gate line GLy, a data line DLx, and a high voltage line VDDx (not shown) for supplying a high voltage. Further, in each pixel P, a switching transistor is interposed between the gate line GLy and the data line DLx, and a driving transistor is formed between a source electrode (or a drain electrode) of the switching transistor and the organic light emitting diode including the anode, the cathode and the organic light emitting layer and the high voltage line VDD.

The driving transistor is an oxide thin film transistor, and may include an oxide layer consisting of Indium Gallium Zinc Oxide (IGZO), Zinc Tin Oxide (ZTO), Zinc Indium Oxide (ZIO), a gate electrode, a source/drain electrode, and the like.

A passivation layer may be formed on the organic light emitting diode, which protects the organic light emitting diode from moisture and oxygen. Also, an adhesive layer may be formed on the passivation layer. A second substrate may be formed on the adhesive layer.

The second substrate may be made of a metal foil or a metal foil alloy and includes a hydrogen capturing metal. In addition, the first substrate may be made of a metal foil or a metal foil alloy and include a hydrogen capturing metal, according to a light emitting direction of the organic light emitting device.

Further, a hydrogen capturing layer made of a metal foil or a metal foil alloy including a hydrogen capturing metal may be formed on an inner surface of at least one of the first substrate or the second substrate, or may be formed on both substrates.

Hereinafter, the organic light emitting device constituting pixels on the above-mentioned organic light emitting display device will be described in detail with reference to the accompanying drawings.

Figure 2:
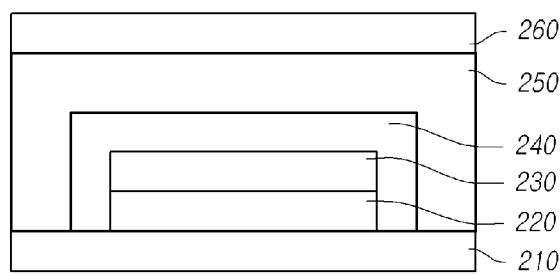
FIG. 2 is a sectional view schematically illustrating an organic light emitting device according to a first exemplary embodiment.

FIG. 2 is a sectional view schematically illustrating an organic light emitting device according to a first exemplary embodiment.

Referring to FIG. 2, an organic light emitting device 200 according to this embodiment includes an oxide thin film transistor 220 arranged on the first substrate 210 in which a pixel region is defined, an organic light emitting diode 230 formed on the oxide thin film transistor 220, a passivation layer 240 formed on the organic light emitting diode 230, an adhesive layer 250 formed on the passivation layer 240, and a second substrate 260 formed on the adhesive layer 250.

Light emission of the organic light emitting device 200 is classified into a top emission in which a light is emitted to the second substrate 260 by reference from the oxide thin film transistor 220 and a bottom emission in which the light is emitted to the first substrate 210 by reference from the oxide thin film transistor 220.

In the organic light emitting device 200 according to one aspect, in the case of the bottom emission, the first substrate 210 and the first electrode, which is a pixel electrode, should be made of a transparent material including a semi-transparent material, while in the case of the top emission, the passivation layer 240, the adhesive layer 250, and the second substrate 260 should be made of the transparent material including the semi-transparent material.

Although the organic light emitting device 200 according to the embodiments will be described as an example of the bottom emission, the present invention is not limited thereto and may be a top emission.

The oxide thin film transistor 220 requires a high driving voltage compared with a poly-silicon transistor, but has an advantage of a low fabrication cost because of a small number of processes. Further, the oxide thin film transistor 220 has an excellent off current characteristic and may be driven by a low frequency equal to or lower than about 60 Hz.

The oxide thin film transistor 220 according to the following embodiments will be described as an example of a bottom gate type in which a gate electrode is formed on a lower portion of a source/drain electrode. However, the present invention is not limited thereto, and may be a top gate type in which the gate electrode is formed on an upper portion of the source/drain electrode.

An organic light emitting diode 230 may be formed on the oxide thin film transistor 220. The organic light emitting diode 230 may include two electrodes and an organic layer. In this case, the organic layer includes an organic light emitting layer, and further includes a hole injection layer, a hole transfer layer, an electron transfer layer, an electron injection layer, and the like for smooth formation of an exciton.

Next, a film type passivation layer 240 is formed on the organic light emitting diode 230, and may be made in the form of an inorganic film containing hydrogen generated during the formation thereof.

A hybrid encapsulation structure may be in a form in which an adhesive layer 250 is formed on the passivation layer 240, and a second substrate 260 is formed on the adhesive layer 250.

Figure 10:
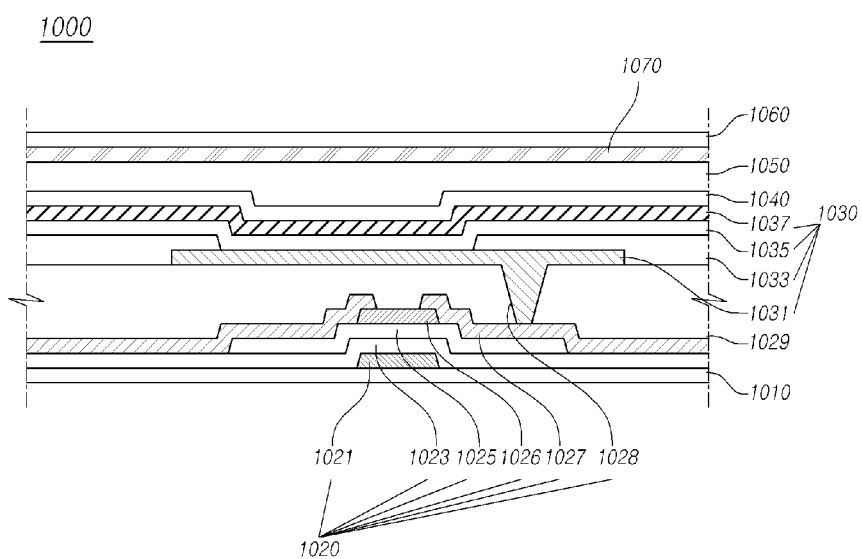
FIG. 10 is a sectional view illustrating an organic light emitting device according to the third exemplary embodiment.

Because the above-mentioned oxide thin film transistor 220 includes an oxide, a threshold voltage shift may occur due to a change of the oxide properties. Therefore, in order to prevent the threshold voltage shift due to residual hydrogen in the organic light emitting device 200, at least one of the first and second substrates 210 and 260 may be formed of a metal foil or a metal foil alloy and include a hydrogen capturing metal. As another example, at least one of the first and second substrates 210 and 260 may include a hydrogen capturing layer formed of metal foil or metal foil alloy which includes a hydrogen capturing metal. FIGS. 10 to 12 show a structure of the organic light emitting device having a separate hydrogen capturing layer coated thereon, and the structure of the organic light emitting device will be described in detail with reference to the corresponding drawings.

The metal foil refers to a metal with malleability and ductility for formation of foil. The metal foil may be made from a relatively plentiful metal, but is not limited thereto. Since the organic light emitting device 200 according to one embodiment is fabricated by using relatively plentiful metal, there is an advantage in reducing a fabricating cost of the organic light emitting display device.

The metal foil alloy may be formed by alloying the above-mentioned metal foil with another metallic material, and may include a hydrogen capturing metal capable of capturing residual hydrogen through interstices of a lattice of a face centered cubic lattice structure or a body centered cubic lattice structure.

Further, the hydrogen capturing metal may be a hydrogen resolving metal capable of dissociating the residual hydrogen in a state from molecules to atoms, but is not limited thereto. In other words, the hydrogen capturing metals are metals with high performance, capable of dissociating a hydrogen molecule into hydrogen atoms so as to form interstitial solid solution or metal hydride.

The metal foil or the metal foil alloy may be a face centered cubic lattice structure or a body centered cubic lattice structure which has interstices of lattice capturing residual hydrogen generated in forming the organic light emitting device 200. The metal foil or the metal foil alloy with the face centered cubic lattice structure or the body centered cubic lattice structure may form the interstitial solid solution or the metal hydride along with residual hydrogen generated in forming the organic light emitting device 200.

The second substrate 260 may have the same thermal expansion coefficient as that of the first substrate 210 to prevent the device 200 from bending when a process is performed at a high temperature.

Hereinafter, the organic light emitting device having the second substrate 260 formed of the metal foil or the metal foil alloy and the method of manufacturing the same will be described with reference to FIGS. 3 to 9D.

Figure 3:
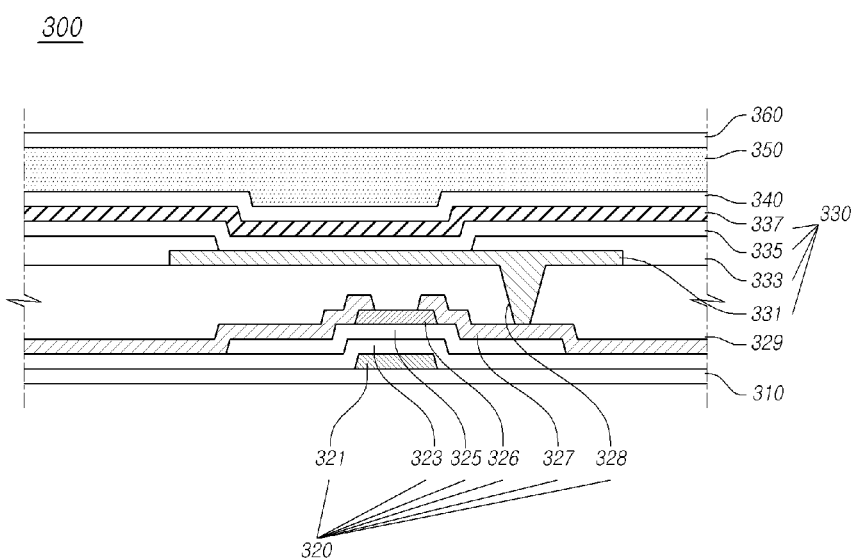
FIG. 3 is a sectional view illustrating an organic light emitting device according to a second exemplary embodiment.

FIG. 3 is a sectional view of an organic light emitting device according to a second exemplary embodiment.

Referring to FIG. 3, an organic light emitting device 300 according to a second embodiment includes an oxide thin film transistor 320 arranged on the first substrate 310 in which a pixel region is defined, an organic light emitting diode 330 formed on the oxide thin film transistor 320, a passivation layer 340 formed on the organic light emitting diode 330, an adhesive layer 350 formed on the passivation layer 340, and a second substrate 360 formed on the adhesive layer 350.

The oxide thin film transistor 320 is formed on the first substrate 310. The oxide thin film transistor 320 includes a gate electrode 321, a gate insulation layer 323 formed on the gate electrode 321 to cover the first substrate 310, an active layer 325 formed of an oxide on the gate insulation layer 323, a source/drain electrode 327 formed on the active layer 325 and connected to the first electrode 331, and an etch stopper 326 formed between the source electrode and the drain electrode 327 on the active layer 325.

The first substrate 310 may be a plastic substrate including polyethylene terephthalate (PET), polyethylene naphthalate (PEN), and polyimide or a glass substrate. Further, the first substrate 310 may further include a buffer layer for isolating penetration of impure elements, which is formed thereon. The buffer layer may be formed of, for example, a monolayer or multiple layers of silicon nitride or silicon oxide.

The gate electrode 321 formed on the first substrate 310 may be formed with a monolayer or multiple layers of at least one metal or alloy of Al, Pt, Pd, Ag, Mg, Au, Ni, Nd, Ir, Cr, Li, Ca, Mo, Ti, W, and Cu.

An insulation film 323 may be formed on the first substrate 310 on which the gate electrode 321 is formed. The gate insulation film 323 may be formed of an inorganic insulation material such as $SiO_x$, $SiN_x$, SiON, $Al_2O_3$, $TiO_2$, $Ta_2O_5$, $HfO_2$, $ZrO_2$, BST, and PZT, an organic insulation material including benzocyclobutene (BCB) and acryl-based resin, or a combination thereof.

The active layer 325 may be formed of an oxide on the gate insulation 323. The active layer 325 may be an oxide, for example, at least one zinc oxide based oxide of indium gallium zinc oxide (IGZO), zinc tin oxide (ZTO) and zinc indium oxide (ZIO), but is not limited thereto.

The source/drain electrode 327 on the active layer 325 and electrically connected to the first electrode 331 may be formed with a mono layer or multiple layers of at least one metal or alloy of Al, Pt, Pd, Ag, Mg, Au, Ni, Nd, Ir, Cr, Li, Ca, Mo, Ti, W, and Cu. Especially, the source/drain electrode 327 may be formed of a metal with a high melting point, such as chrome (Cr) or tantalum (Ta), but is not limited thereto.

The etch stopper 326 may be formed between the source/drain electrodes 327 on the active layer 325, which prevents the active layer 325 from being etched by an etching solution when a patterning process is performed on the oxide thin film transistor 320 by photolithography. However, the etch stopper 326 may be omitted according to the etching solution.

A planarization layer 329 may be formed on the source/drain electrode 327 to cover the source/drain electrodes 327 and the gate insulation film 323. The planarization layer 329 may be formed of, for example, at least one of silicon oxynitride (SiON), silicon nitride (SiNx), silicon oxide (SiOx), and aluminum oxide (AlOx) as a hydrogen containing inorganic film with a hydrophobic characteristic, sufficient mechanical strength, water vapor resistance, and trouble-free film formation.

The organic light emitting diode 330 may be formed on the planarization layer 329, which may include a first electrode 331, a bank 333, an organic layer 335, and a second electrode 337.

The first electrode 331 may be electrically connected to the source/drain electrode 37 through a via hole 328 formed in the planarization layer 329.

The first electrode 331 may be formed of a transparent conductive material having a relatively large work function and playing a role of an anode electrode (positive electrode). For example, a metal oxide such as indium tin oxide (ITO) or indium zinc oxide (IZO), a mixture of a metal and an oxide such as ZnO: Al or SnO2: Sb, and conductive polymer such as poly (3-methyl-thiophene), poly [3,4-(ethylene-1,2-dioxy) thiophene] (PEDT), polypyrrole, polyaniline, etc., may be used as the transparent conductive material. Further, the first electrode 331 may be a carbon nanotube, graphene, a silver nanowire, and the like.

In the case of the top emission, a reflection plate made of a metal material with excellent reflection efficiency, for example, aluminum (Al) or silver (Ag), may be further formed as an auxiliary electrode on upper and lower portions of the first electrode 331 in order to improve the reflection efficiency.

The bank 333 may be formed on an edge portion of the first electrode 331, in which an opening is formed, so that the first electrode 331 is exposed. The bank 333 may be formed of an inorganic insulation material such as silicon nitride (SiNx) and silicon oxide (SiOx), an organic insulation material such as benzocyclobutene or acrylic resin, or a combination thereof, but is not limited thereto.

An organic layer 335 may be formed on the first electrode 331 which is exposed, on which a hole injection layer (HIL), a hole transfer layer (HTL), an emitting layer (EL), an electron transfer layer (ETL), an electron injection layer (EIL), and the like may be sequentially laminated so that a hole and an electron are smoothly transferred to form an exciton.

A second electrode 337, which is a cathode electrode, may be formed on the organic layer 335. In the case of the bottom emission, for example, the second electrode 337 may be formed of a metal with a monolayer or multiple layers of an alloy in which a first metal, e.g., silver (Ag), and a second metal, e.g., magnesium, are mixed in a desired proportion.

The passivation layer 340 may be formed on the organic light emitting diode 330 to cover an entire upper surface of the second electrode 337.

The passivation layer 340 may be formed of, for example, at least one of silicon oxy-nitride (SiON), silicon nitride (SiNx), silicon oxide (SiOx), and aluminum oxide (AlOx) as a hydrogen containing inorganic film with a hydrophobic characteristic, sufficient mechanical strength, water vapor resistance, and trouble-free film formation.

A film type passivation layer 340 postpones permeation of moisture or oxygen, to prevent the organic layer 335, which is sensitive to moisture or oxygen, from absorbing the moisture.

The passivation layer 340 also functions as a protection layer, and may further include a bit having at least one metal of Ba, Ca, Cu, Fe, Hf, La, Mg, Nb, Pd, Pt, Se, Sr, Ta, Ti, V, and Zr and prevent residual hydrogen in the device from being diffused into the oxide thin film transistor 320.

The passivation layer 340 may be formed of a monolayer having a thickness of about 0.5 μm to about 1.0 μm, or multiple layers without a limitation thereto.

The planarization layer 329 or the passivation layer 340 may be formed in processes of a chemical vapor deposition, a physical vapor deposition, a plasma vapor deposition, and the like. Particularly, when the planarization layer 329 or the passivation layer 340 is formed in the chemical vapor deposition process, hydrogen is not withdrawn and remains in the organic light emitting device 300. A problem in of residual hydrogen generated in the panel will be described later.

Further, the adhesive layer 350 may be formed on the passivation layer 340, which may be formed of a transparent adhesive material with an excellent optical transmission, for example, an adhesive film or optical cleared adhesive (OCA). The adhesive layer may be formed in a manner of a metal lid, a frit sealing, a thin film deposition, or another suitable process.

The adhesive layer 350 may have a face sealing structure of adhering on a face of the second substrate 360, but is not limited thereto. The adhesive layer 350 protects the organic light emitting diode 330 from external contamination such as moisture, and also flattens the second substrate 360 encapsulating the organic light emitting diode 330.

Further, the adhesive layer 350 functions as a protection layer, and may further include a bit of at least one metal of Ba, Ca, Cu, Fe, Hf, La, Mg, Nb, Pd, Pt, Se, Sr, Ta, Ti, V, and Zr and prevent residual hydrogen in the device from being diffused into the oxide thin film transistor 320.

The second substrate 360 may be formed on the adhesive layer 350. The second substrate 360 may be formed of a metal foil with malleability and ductility for formation of foil. Especially, the metal foil may include a relatively available element, for example, Fe, Cu, Al, and the like as described above, with advantages of a competitive material and manufacturing costs.

In addition, the second substrate 360 may be formed by alloying metal foil with another metallic material, and may include a hydrogen capturing metal capable of capturing residual hydrogen through the interstices in the lattice of the face centered cubic lattice structure or the body centered cubic lattice structure. The hydrogen capturing metal may be at least one of Ba, Ca, Cu, Fe, Hf, La, Mg, Nb, Ni, Pd, Pt, Se, Sr, Ta, Ti, V, and Zr. Particularly, the second substrate 360 may be a metal foil alloy including one or more hydrogen capturing metals based on the above-mentioned metal foil.

The hydrogen capturing metal may be a hydrogen resolving metal capable of dissociating and capturing the residual hydrogen molecule through physical and chemical absorption. The hydrogen resolving metal may be a metal catalyst used as a catalyst in a hydrogen resolving reaction.

The second substrate 360 formed of the metal foil or the metal foil alloy including the hydrogen capturing metal based on the metal foil may have the same thermal expansion coefficient as that of the first substrate 310. If both substrates 310 and 360 have different thermal expansion coefficients, the device may bend when the process is performed in a high temperature condition. If the organic light emitting device 300 is bent, light modulation may be impossible resulting in image distortion.

Therefore, in the case that the second substrate 360 is formed of the metal foil alloy, a composition ratio of the metal foil alloy must be designed so that the second substrate 360 has the same thermal expansion coefficient as that of the first substrate 310. For example, if the first substrate 310 is the glass substrate and has the thermal expansion coefficient of 2.5 ppm/° C.~5.5 ppm/° C., the second substrate 360 may be a metal foil alloy of iron and nickel in which a composition ratio of nickel added to iron is about 33%~42%.

Since the metal foil or the metal foil alloy has the body centered cubic lattice structure or the face centered cubic lattice structure and residual hydrogen expands or is absorbed between metal lattices, it is possible to prevent expansion of the residual hydrogen toward the oxide thin film transistor 320.

Figure 4A:
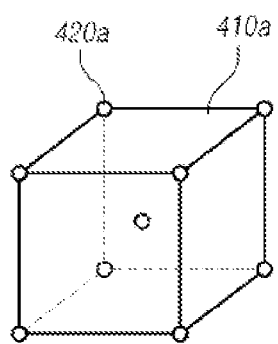
FIG. 4A is a perspective view illustrating a body centered cubic lattice configuration of a single metal foil constituting a second substrate.
Figure 4B:
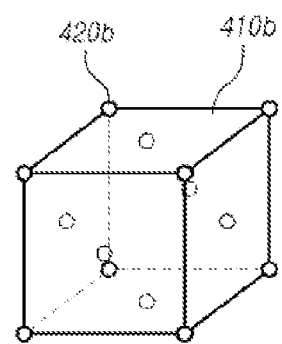
FIG. 4B is a perspective view illustrating a face centered cubic lattice configuration of the single metal foil constituting the second substrate.

FIG. 4A is a perspective view illustrating a body centered cubic lattice structure of a single metal foil constituting the second substrate, and FIG. 4B is a perspective view illustrating a face centered cubic lattice structure of the single metal foil constituting the second substrate. Further, FIG. 5A is a perspective view illustrating a body centered cubic lattice structure of a metal foil alloy constituting the second substrate, and FIG. 5B is a perspective view illustrating a face centered cubic lattice structure of the metal foil alloy constituting the second substrate.

Referring to FIG. 4A, the body centered cubic lattice structure of the metal foil constituting the second substrate 360 is a unit crystal lattice in which eight atoms 420a are arranged at eight corners of the cubic lattice 410a respectively, and one atom 420a is present at the center of the lattice 410a. The number of atoms in the unit lattice is two. The metal foil of the body centered lattice structure may be Li, Na, Cr, α-Fe, Mo, W, K, etc.

Figure 5A:
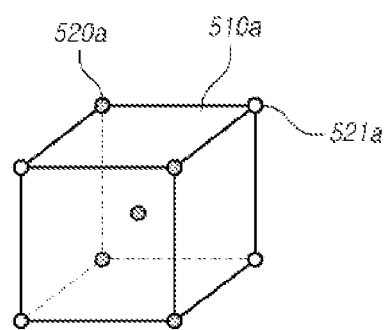
FIG. 5A is a perspective view illustrating a body centered cubic lattice configuration of a metal foil alloy constituting a second substrate.
Figure 5B:
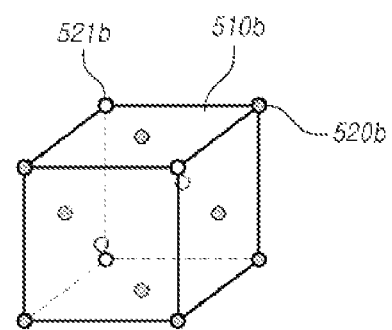
FIG. 5B is a perspective view illustrating a face centered cubic lattice configuration of the single metal foil alloy constituting the second substrate.
Figure 6A:
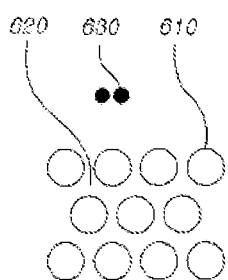
FIGS. 6A to 6D are sectional views illustrating a mechanism in which residual hydrogen generated during a device process is captured in a metal foil or a metal foil alloy having a lattice configuration.
Figure 6B:
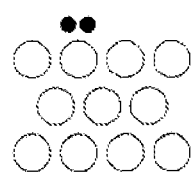
Figure 6C:
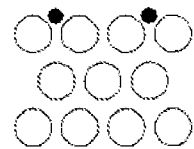
Figure 6D:
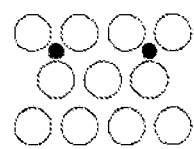

Referring to FIG. 5A, in the case of the body centered cubic lattice structure of the metal foil alloy constituting the second substrate 360, the first metal 520a is located at four corners and a center of the lattice 510a, and the second metal 521a is located at four remaining corners of the lattice. Here, the first metal may be the metal foil having the body centered cubic lattice structure, and the second metal may be the hydrogen capturing metal. However, the first metal and the second metal are not limited thereto. Further, a relative position of the first metal 520a and the second metal 521a may be varied according to the composition ratio or a forming condition thereof.

In addition, a packing factor of the metal foil or the metal foil alloy constituting the second substrate 360 having the body centered cubic lattice structure may be, for example, about 68%.

Referring to FIG. 4B, in the face centered cubic lattice structure of the metal foil constituting the second substrate 360, an atom 420b is arranged at each corner and in the center of each face of the lattice 410b, and the number of atoms in a unit lattice is four. The metal foil of the face centered cubic lattice structure may be Pt, Pb, Ni, γ-Fe, Cu, Al, Au, Ag, etc.

Referring to FIG. 5B, in the face centered cubic lattice structure of the metal foil alloy constituting the second substrate 360, the first metal 520a is arranged at the center and four corners of the lattice 510b and the centers of four faces, and the second metal 521b is arranged at four corners and two faces. Herein, the first metal may be the metal foil having the face centered cubic lattice structure, and the second metal may be the hydrogen capturing metal. However, the first metal and the second metal are not limited thereto. Further, a relative position of the first metal 520a and the second metal 521a may be varied according to the composition ratio or a condition of forming the metals.

Furthermore, a packing factor of the single metal foil or the metal foil alloy having the face centered cubic lattice structure is, for example, about 74%.

Accordingly, when the second substrate 360 is formed of the metal foil or the metal foil alloy having the body centered cubic lattice structure, pores of about 32% are formed. If the second substrate 360 is formed of the metal foil or the metal foil alloy having the face centered cubic lattice structure, pores of about 26% are formed. Therefore, residual hydrogen generated in the process of depositing the passivation layer 340 or the planarization layer 329 may be diffused in the second substrate 360, and solidified in the metal foil so as to form the solid solution or the metal hydride, thereby storing the residual hydrogen in the organic light emitting device 300.

FIGS. 6A to 6D are sectional views illustrating a mechanism in which residual hydrogen generated during a device process is captured in a metal foil or a metal foil alloy having a lattice structure.

Referring to FIGS. 3, 4A, 4B, 5A, 5B and 6A-6D, the residual hydrogen 630 deoxidizes an oxide on the active layer 325 of the oxide thin film transistor 320, so as to change characteristics of the device.

That is, gas is decomposed in various forms and remains in the device when it is in a plasma state. For example, in a deposition process, such as plasma enhanced chemical vapor deposition (PECVD), using plasma of silicon hydride ($SiH_4$) and amine ($NH_3$) gas, diffusible hydrogen that can easily move within a solid in a monoatomic or ion state at a relatively low temperature and non-diffusible hydrogen bonded to another atom may generate a molecule.

In the case of a general organic light emitting device 300, when the residual hydrogen is present, it can freely move within the solid. Especially, in the case of using a typical glass substrate, the residual hydrogen 630 may be confined between both glass substrates. If this occurs, some hydrogen may approach and degrade the active layer 325 of the oxide thin film transistor 320.

Especially, if silicon nitride (SiNx), silicon oxynitride (SiON), or the like is formed as the planarization layer 329 or the passivation layer 340 by the plasma enhanced chemical vapor deposition (PECVD), a large amount of hydrogen and impurities are generated. In the case of the organic light emitting device 300, since a processing temperature is limited within 100° C. to minimize thermal damage to the organic light emitting diode 330, the amount of the residual hydrogen 630 increases.

With reference to chemical formula (1), when the silicon nitride is deposited by using a mixed gas of $SiH_4$ and $NH_3$ in the process of the plasma chemical vapor deposition, so as to form the passivation layer 340, the residual hydrogen (H2) 630 of about 15-40% is generated.

$$SiH_4 + 2NH_3 \rightarrow SiN_2 + 5H_2 \tag{1}$$

Figure 7A:
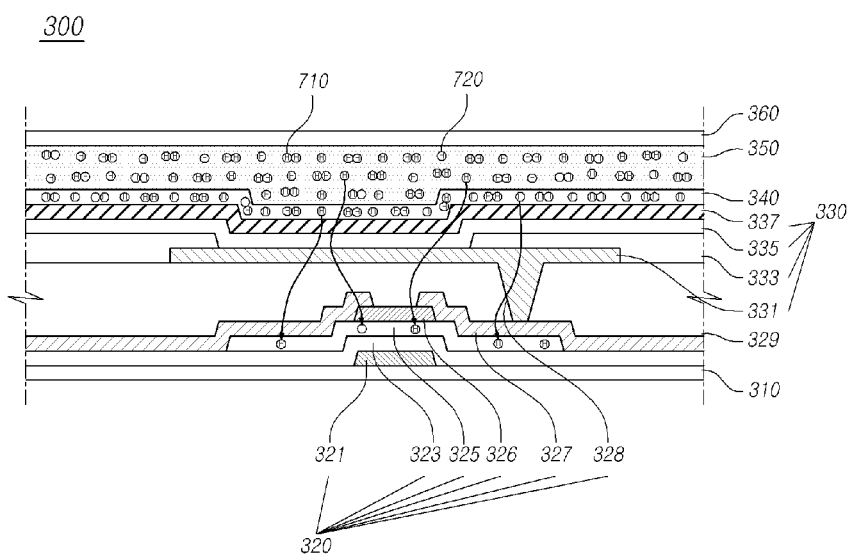
FIG. 7A is a sectional view illustrating a general organic light emitting device in which residual hydrogen is diffused throughout an oxide thin film transistor so as to shift a threshold voltage of the oxide thin film transistor.
Figure 7B:
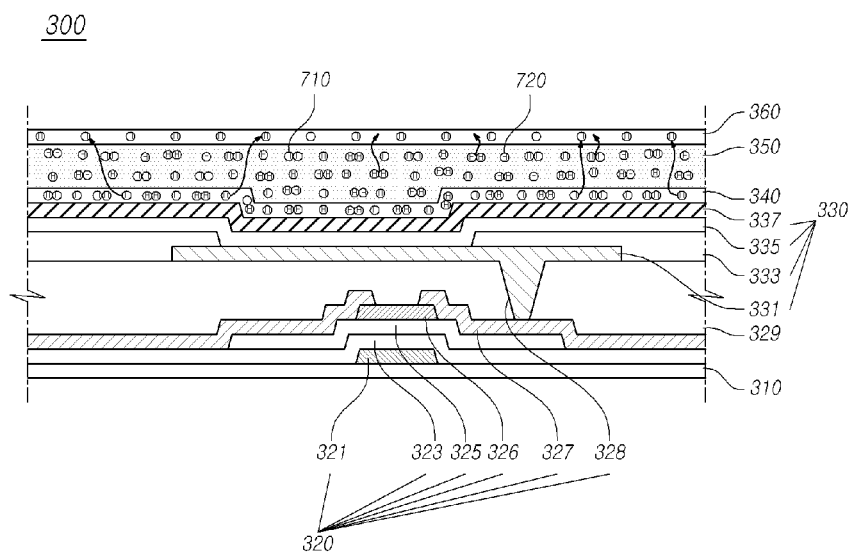
FIG. 7B is a sectional view illustrating an organic light emitting device in which residual hydrogen is diffused into a second substrate according to the second exemplary embodiment of FIG. 3.

FIG. 7A is a sectional view illustrating a general organic light emitting device in which the residual hydrogen is diffused into the oxide thin film transistor so as to shift a threshold voltage of the oxide thin film transistor. FIG. 7B is a sectional view illustrating an organic light emitting device according to the second embodiment of FIG. 3, in which the residual hydrogen is diffused into the second substrate.

Referring to FIG. 7A, the second substrate 360 is a glass substrate, and the residual hydrogen 630 generated in the deposition process includes non-diffusible hydrogen 710 in a molecule and diffusible hydrogen 720 dissociated in an atomic state. The diffusible hydrogen 720, which is generated in the deposition process of the passivation layer 340 and the adhesive layer 350 and remains within the device, is not captured in the first substrate 310 or the second substrate 360, especially, the second substrate 360. Therefore, the diffusible hydrogen 720 may be freely diffused between the first substrate 310 and the second substrate 360. Thus, some of the diffusible hydrogen 720 is diffused within the oxide thin film transistor 320, so as to deoxidize the oxide constituting the active layer 325 of the oxide thin film transistor 320.

The deoxidization of the active layer 325 causes a change in an electric behavior of the oxide thin film transistor 320, resulting in a threshold voltage shift. If the extent of the threshold voltage shift is deviated from a range of a compensation for a circuit of an organic light emitting display panel, the threshold voltage shift can result in a stain or a deviation of luminance on the screen.

Referring to FIG. 7B, in the organic light emitting device 300 according to the second embodiment in which the second substrate 360 is formed of the metal foil or the metal foil alloy, when the diffusible hydrogen 720 present in a lamination structure such as the planarization layer 329 or the passivation layer 340 is diffused through the adhesive layer 350 and approaches the surface of the second substrate 360, the diffusible hydrogen 720 is captured within the second substrate 360, so as to form the interstitial solid solution or the metal hydride. Thereby, it is possible to prevent the deoxidization of the oxide thin film transistor 320.

For example, a diffusion rate of the residual hydrogen 630 within iron (Fe) which is one of components for the metal foil is, for example, $1\times10^{-4}$ cm$^2$/sec at the normal temperature and is faster, compared with a diffusion rate of hydrogen within carbon or nitrogen, for example, $1\times10^{-16}$ cm$^2$/sec. The diffusion rate of the hydrogen is faster within a polymer material because of a presence of more free volume due to a structure of the polymer. It can be noted that the diffusion rate of the hydrogen within the polymer material is faster than a diffusion rate of hydrogen within a general polymer material, e.g., $1\times10^{-4}$ cm$^2$/sec. Accordingly, since the diffusion rate of the residual hydrogen 630 within the second substrate 360 is relatively faster than that within the adhesive layer 350 formed of the polymer material, the residual hydrogen 630 may be diffused into interstices 620 of the lattice of the metal foil or the metal foil alloy (illustrated in FIG. 6) constituting the second substrate 360.

With reference to chemical formula (2), the metal foil or the metal foil alloy 610 constituting the second substrate 360 may chemically react with hydrogen molecules or hydrogen atoms diffused and approaching the surface of the second substrate 360, so as to form the metal hydride.

$$2Me+xH_2 \rightarrow 2MeH_x \qquad (2)$$

(Me: the metal foil or metal foil alloy)

For example, hydrogen capturing metals included in the metal foil alloy, for example, Ca, Nb, Pd, Se, Sr, Ta, Ti (especially, β-Ti), and V among Ba, Ca, Cu, Fe, Hf, La, Mg, Nb, Ni, Pd, Pt, Se, Sr, Ta, Ti, V, and Zr form the metal hydride along with the residual hydrogen.

The non-diffusible hydrogen 710 may form an interstitial solid solution in the second substrate 360 made of the metal foil or the metal foil alloy through physical and chemical absorption. For example, in the case of the metal foil alloy such as Fe—Ti, La—Ti, Mg—Ni, etc., although the hydrogen is not diffusible hydrogen but a hydrogen molecule, when the hydrogen is physically absorbed on the surface of the metal foil or the metal foil alloy 610 by Van Der Waals attraction (see FIG. 6B and chemical formula (3)), the hydrogen is chemically absorbed through a process of dissociating the hydrogen to hydrogen atoms (see FIG. 6(C) and chemical formula (4), below) and is diffused into the interstice 620 in the body centered cubic lattice structure or the face centered cubic lattice structure, so as to be the interstitial solid solution (see FIG. 6(D)).

$$2Me+H_2 \rightarrow 2MeH_{ads} \qquad (3)$$

$$MeH_{ads} \rightarrow MeH_{abs} \qquad (4)$$

According to the above-mentioned principle, the residual hydrogen 630 within the organic light emitting device 300 is effectively captured and stored in the second substrate 360 formed of the metal foil or the metal foil alloy, thereby preventing a functional degradation of the oxide thin film transistor 320 due to the residual hydrogen 630.

Briefly, in the case that the second substrate 360 is formed of the metal foil or the metal foil alloy, the residual hydrogen 630 in the organic light emitting device 300 is effectively diffused and captured, so as to prevent the deoxidization of the oxide of the above-mentioned oxide thin film transistor 320. Thereby, it is possible to prevent an inferior organic light emitting device 300 and to produce the organic light emitting device 300 with a low cost and high efficiency. Further, since instability restricted in the oxide thin film transistor 320 can be reduced, applications may increase.

Up to now, the organic light emitting device 300 according to the second embodiment has been described. Hereinafter, a process of fabricating an organic light emitting device according to this embodiment will be described.

Figure 8:
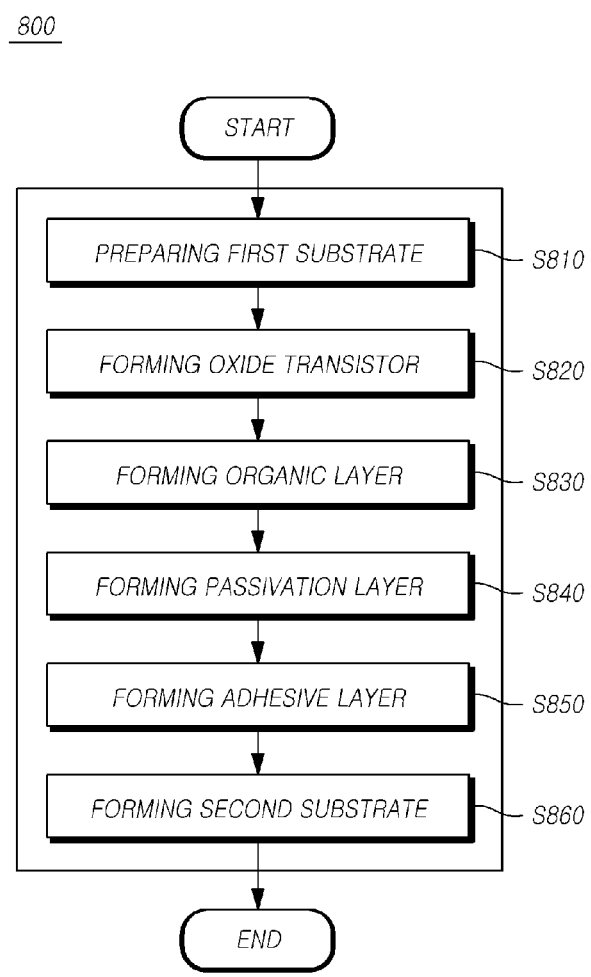
FIG. 8 is a flowchart illustrating a process of fabricating an organic light emitting device according to the second exemplary embodiment.

FIG. 8 is a flowchart illustrating a process of fabricating an organic light emitting device according to the second exemplary embodiment.

Referring to FIGS. 3 and 8, the process 800 of fabricating the organic light emitting device according to the second embodiment includes preparing a first substrate 310 in which a pixel region is defined in step S810, forming an oxide thin film transistor 320 on the first substrate 310 in step S820, forming an organic light emitting diode 330 on the oxide thin film transistor in correspondence to the pixel region of the first substrate 310 in step S830, forming a passivation layer 340 on the organic light emitting diode 330 in step S840, forming an adhesive layer 350 on the passivation layer 340 in step S850, and forming a second substrate 360 made of a metal foil or a metal foil alloy including a hydrogen capturing metal in step S860.

First, the first substrate 310 in which the pixel region is defined is prepared in step S810. In step S810, the preparing of the first substrate 310 may include cleaning a surface of the first substrate 310 with a plasma treatment in order to improve the surface of the first substrate 310.

Then, the oxide thin film transistor 320 is formed on the first substrate 310 in step S820. In step S820, the oxide thin film transistor 320 including the oxide may be formed on the first substrate 310 in which the pixel is defined.

In step S820, a gate electrode 321 may be formed in a photolithography manner, and a gate insulation film 323 is deposited on the substrate 310 to cover the gate electrode 321. Then, the active layer 325 is deposited on the gate insulation film 323. An etch stopper 326 may be formed on the active layer 325 in order to prevent the metal oxide from being influenced, but may be omitted according to the etching solution. If the etching solution does not attack the metal oxide the etch stopper would not be necessary.

Continuing, a source/drain electrode 327 is formed in a photolithographic manner to have a double step, and a planarization layer 329 is formed on the gate insulation film 323 to cover an exposed portion of the source/drain electrode 327 and the active layer 325. Then, the planarization layer 329 is patterned to form a via hole 328 exposing the source/drain electrode 327.

The planarization layer 329 may be a hydrogen containing inorganic film such as silicon oxynitride (SiON), silicon nitride (SiNx), silicon oxide (SiOx), and aluminum oxide (AlOx). The planarization layer 329 may be formed by a process of a chemical vapor deposition, a physical vapor deposition, a plasma vapor deposition, and the like.

In this embodiment, although the oxide thin film transistor 320 having the bottom gate has been described, the oxide thin film transistor 320 may be fabricated in a top gate manner.

Next, the organic light emitting diode 330 is formed on the oxide thin film transistor 320 in step S830. The organic light emitting diode includes a first electrode 331 electrically contacting the source/drain electrode 327 of the oxide thin film transistor 320 through the via hole 328, an organic layer 335 including an organic light emitting layer formed on the first electrode, and a second electrode 337 formed on the organic layer 335. For smooth formation of an exciton, the organic layer 335 may include a hole injection layer, a hole transfer layer, an organic light emitting layer, an electron transfer layer, an electron injection layer, and the like.

In step S830, a bank 333 made of an inorganic insulation material, an organic material or a combination thereof is formed on the first electrode in a non-light emitting region in order to define a light emitting region.

The organic layer 335 may be formed in processes of a chemical vapor deposition, a physical vapor deposition, a solution process, and the like. For example, the organic light emitting layer may be formed in a manner of depositing an RGB light emitting material using a fine metal mask (FMM) or using laser induced thermal imaging (LITI). Further, after a white light emitting material is deposited on a whole surface, a color filter may be used in a next process.

In turn, a second electrode 337 is formed on an organic layer 335 through a thermal evaporation, an ion beam deposition, or other suitable process.

Next, the passivation layer 340 is formed on the organic light emitting diode 330 in step S840. In step S840, the passivation layer 340 may be formed in processes of the chemical vapor deposition, the physical vapor deposition, the plasma chemical vapor deposition, and the like. The passivation layer 340 may be formed of a hydrogen containing inorganic film which contains hydrogen generated in the process.

Next, the adhesive layer 350 is formed on the passivation layer 340 in step S850. The adhesive 350 may be formed of a transparent adhesive material with an excellent light transmission.

The second substrate 360 is formed on the adhesive layer 350 in step S860.

In this step S860, the second substrate 360 may be made of a metal foil or a metal foil alloy and includes a hydrogen capturing metal. The second substrate 360 may include a hydrogen capturing layer formed of a metal foil or a metal foil alloy including a hydrogen capturing metal based on the metal foil, on an inner surface thereof.

In the step S850 of forming the adhesive layer and the step S860 of forming the second substrate, the adhesive layer and the second substrate may have a face encapsulation structure.

FIGS. 9A to 9D are sectional views illustrating an organic light emitting device in a sequence of processes of fabricating the organic light device according to the second embodiment.

Figure 9A:
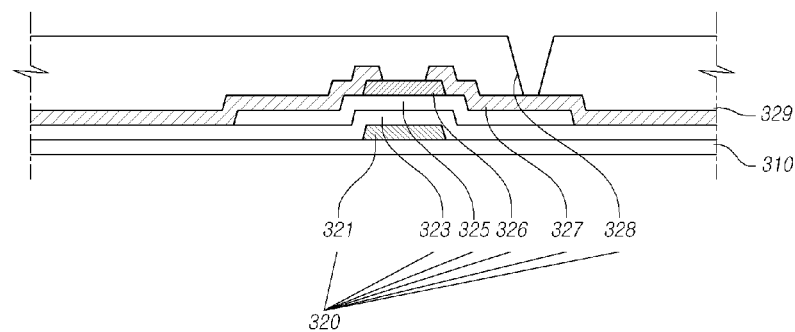
FIGS. 9A to 9D are sectional views illustrating an organic light emitting device in sequence of processes of fabricating the organic light device according to a third exemplary embodiment.

Referring to FIG. 9A first, after the first substrate 310 is prepared and cleaned, the oxide thin film transistor 320 is formed. In cleansing the first substrate 310, a plasma treatment may be performed to improve the surface.

A material with excellent mechanical strength or dimensional stability may be selected as a material for forming the first substrate 310. The organic light emitting device 300 according to one embodiment is a bottom emission type, and the first substrate 310 may be a plastic substrate including polyethylene terephthalate (PET), polyethylene naphthalate (PEN), and polyimide or a glass substrate.

The first substrate 310 may further include a buffer layer for isolating penetration of an impure element, which may be formed thereon. The buffer layer may be formed of, for example, a monolayer or multiple layers of silicon nitride or silicon oxide.

The oxide thin film transistor 320 is formed on the first substrate 310.

In the bottom emission type of the oxide thin film transistor 320, a gate electrode 321 made of a conductive metal having a small electric resistance and a tensile stress such as aluminum, copper, and the like is formed on the first substrate 310 formed of an insulation material.

The gate electrode 321 may be formed of a monolayer or multiple layers of at least one metal or alloy of Al, Pt, Pd, Ag, Mg, Au, Ni, Nd, Ir, Cr, Li, Ca, Mo, Ti, W, and Cu.

The gate insulation film 323 may be formed of an inorganic insulation material such as $SiO_x$, $SiN_x$, SiON, $Al_2O_3$, $TiO_2$, $Ta_2O_5$, $HfO_2$, $ZrO_2$, BST, and PZT, an organic insulation material including benzocyclobutene (BCB) and acryl-based resin, or a combination thereof. An active layer 325 made of a zinc oxide based oxide such as IGZO, zinc tin oxide (ZTO), zinc indium oxide (ZIO), and the like is formed on the gate insulation layer 323, so that the gate electrode 321 is placed at a center of the active layer 325.

The source/drain electrode 327 is formed on the active layer 325 by a mono layer or multiple layers of at least one metal or alloy of Al, Pt, Pd, Ag, Mg, Au, Ni, Nd, Ir, Cr, Li, Ca, Mo, Ti, W, and Cu. Especially, the source/drain electrode 327 may be formed of a metal with a high melting point, such as chrome (Cr) or tantalum (Ta), but is not limited thereto.

In the process of forming the oxide thin film transistor 320, after the conductive metal such as aluminum, copper, and the like is deposited in the chemical vapor deposition or the physical vapor deposition such as sputtering, the conductive metal may be patterned by photolithography so as to form the gate electrode 321.

Then, silicon oxide or silicon nitride is deposited in the chemical vapor deposition to cover the gate electrode, to form the gate insulation film 323.

Indium gallium zinc oxide (IGZO), zinc tin oxide (ZTO), or zinc indium oxide (ZIO), and the like, in which impurities are not doped, are sequentially deposited, thereby forming the active layer 325.

Continuing, the source/drain electrode 327 may be formed to have a double step by depositing a metal such as chrome, tantalum, or the like in a deposition process including the chemical vapor deposition and in a photolithographic manner.

Next, a hydrogen containing inorganic film, for example, silicon oxide or silicon nitride, is deposited on the gate insulation film 323 to cover an exposed portion of the source/drain electrode 327 and the active layer 35, thereby forming the planarization layer 329. In this case, since the source/drain electrode 327 has the double step, it is possible to degrade step coverage of the planarization layer 329.

Then, the planarization layer 329 is patterned to form a via hole 328 exposing the drain electrode 327.

Figure 9B:
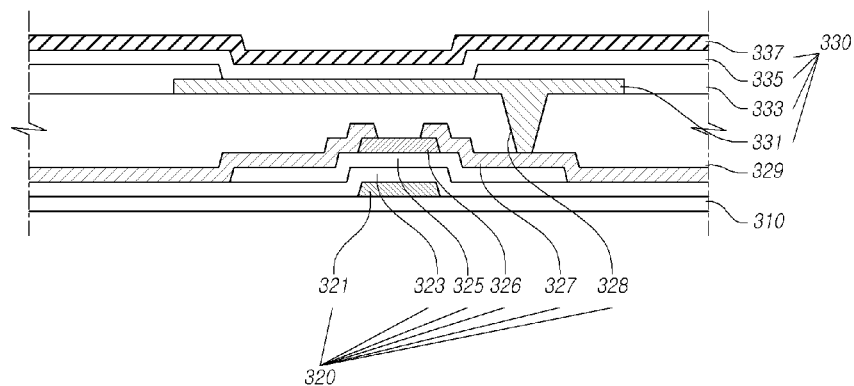

Referring to FIG. 9B, an organic light emitting diode 330 including a first electrode, an organic layer, and a second electrode is formed.

First, the first electrode 331 is formed on the planarization layer 329. The first electrode 331 is formed in each pixel region, which is electrically connected to the drain electrode 327 through the via hole 38 and may be patterned by using a transparent material. After a photoresist is coated, the photoresist is patterned through a photolithographic process in which the photoresist is removed away through processes of pre-baking, exposure, development, post-baking, and etching. The first electrode 331 may be an anode generating a hole.

Then, a bank 333 is formed at an edge portion of the first electrode 331 and has an opening to expose a part of the first electrode 331. The bank 333 has an unsmooth surface on which various wires and transistors are arranged, and is used to prevent the organic material from being deteriorated when an organic film is formed on the surface of the bank 333 which has unevenly formed steps. That is, the bank 333 is formed in a non-light emitting region to distinguish a region in which the oxide thin film transistor 320 and various wires are formed from a light emitting region in which thin films are merely laminated on a flat substrate.

An organic layer 335 is formed on the first electrode 331 and the bank 333 which are exposed. More particularly, the hole injection layer (HIL), the hole transfer layer (HTL), the light emitting layer (EL), the electron transfer layer (ETL), and the electron injection layer (HIL) are sequentially laminated. Holes and electrons combine on the light emitting layer to form an exciton, and the exciton drops from an excited state to a ground state to emit light, thereby displaying an image.

The organic layer 335 may be formed by a chemical vapor deposition, a physical vapor deposition, a solution process, and the like. For example, the organic light emitting layer may be formed in a manner of depositing an RGB light emitting material using a fine metal mask (FMM) or performing the solution process such as laser induced thermal imaging (LITI) or a coating. The LITI is a process in which a laser beam is selectively emitted on a donor film and a thin film is selectively transferred by radiated heat. In the case of using a white light emitting device, a face surface is formed on the first electrode 331, and a color filter is deposited.

The second substrate 337 may be formed on the organic layer 335. The second electrode 337 may be a cathode, and may be made of a conductive material with a relatively small work function value. For example, the second electrode 337 may be formed of a metal with a monolayer or multiple layers of alloy in which a first metal, e.g., silver (Ag), and a second metal, e.g., magnesium, are mixed in a desired proportion.

In this case, the second electrode 337 may be formed by a low temperature deposition in order to minimize damage of the organic layer 335 due to heat or plasma, but is not limited thereto.

Figure 9C:
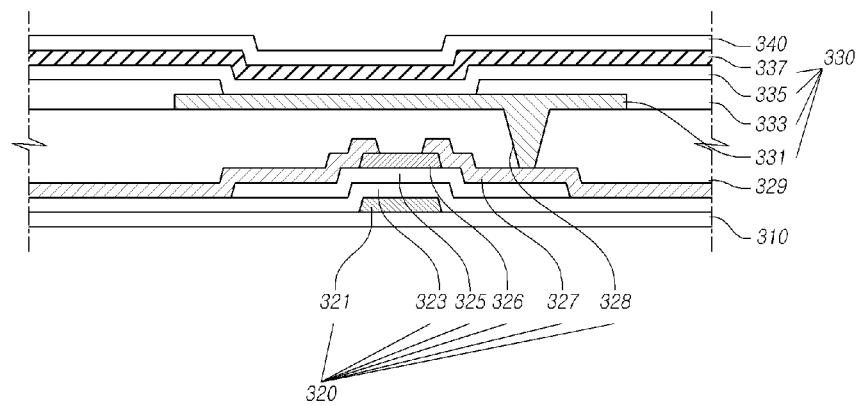

Referring to FIG. 9C, the passivation layer 340 may be formed on the organic light emitting diode 330.

The passivation layer 340 plays a role of primarily protecting the organic light emitting diode 330 from moisture and impurities. The passivation layer 340 may be formed of silicon oxynitride (SiON), silicon nitride (SiNx), silicon oxide (SiOx), or aluminum oxide (AlOx) through a chemical vapor deposition, a physical vapor deposition, a plasma chemical vapor deposition, and the like. In this process, residual hydrogen 630 is generated.

The passivation layer 340 is a hydrogen containing inorganic film which is formed of, for example, silicon oxynitride (SiON), silicon nitride (SiNx), silicon oxide (SiOx), or aluminum oxide (AlOx), and contains hydrogen generated in the deposition process, and is formed with a monolayer to have a thickness of about 0.5 µm to about 1.0 µm, but is not limited thereto and may be formed with multiple layers.

As described above with reference to the chemical formula (1), the silicon nitride may be deposited by using a mixed gas of $SiH_4$ and $NH_3$ in the plasma chemical vapor deposition process, so as to form the passivation layer 340.

Figure 9D:
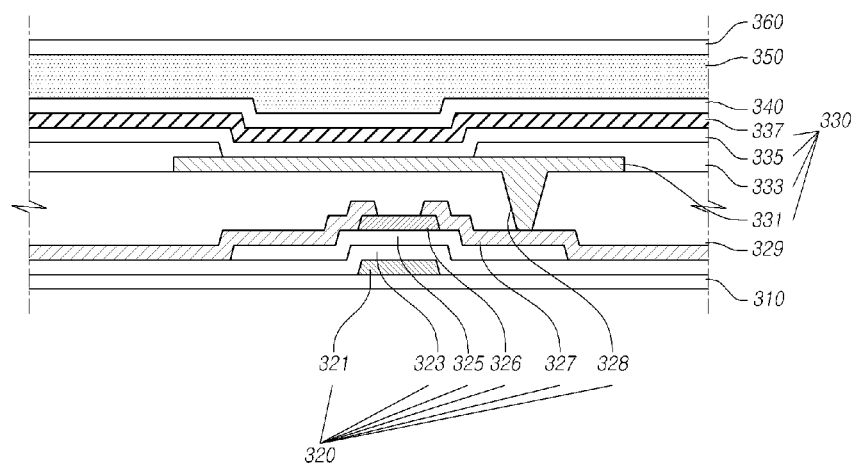

Referring to FIG. 9D, after the passivation layer 340 is formed, the adhesive layer 350 and the second substrate 360 are combined, so that the organic light emitting device 300 according to another embodiment is completed.

An encapsulation according to one embodiment may be performed in a face encapsulation manner. That is, a film type adhesive layer 350 may be formed on the passivation layer 340, and finally a second substrate 360 made of a metal foil or a metal foil alloy is formed.

According to the embodiments of the present invention, a hybrid encapsulation in which the passivation layer 340 is deposited and the second substrate 360 is formed is used in an adhesive manner, but an adhesive manner is not limited thereto. Accordingly, the adhesive manner may be a metal lead or a glass lead in which the second substrate 360 made of the metal foil or the metal foil alloy covers the device and is adhered by a sealant, a frit sealing manner in which a frit including glass powder is cured to encapsulate the first substrate 210 with the second substrate 360 and the substrate, or an encapsulation manner using a thin film deposition.

To form the second substrate 360 on the adhesive layer 350, first the second substrate 360 is prepared and impurities on the second substrate 360 are removed through a UV cleaning using ultraviolet radiation, for example. The second substrate 360 may be formed of a metal foil or a metal foil alloy including a hydrogen capturing metal capable of storing diffusible hydrogen 720 and non-diffusible hydrogen 710 in the device.

After a cleaning step, residual gas is removed from the adhesive layer 350, the adhesive layer 350 and the second substrate 360 are adhered, and then a hybrid type of the organic light emitting device 300 can be completed.

The organic light emitting device in which the second substrate 260 is made of the metal foil or the metal foil alloy and the method of fabricating the same have been described up to now with reference to FIGS. 3 to 9D. Hereinafter, an organic light emitting device including a hydrogen capturing layer made of a metal foil or a metal foil alloy on an inner surface of a second substrate 260 and a method of fabricating the same will be described with reference to FIGS. 10 to 11D.

FIG. 10 is a sectional view of an organic light emitting device according to a third exemplary embodiment.

Referring to FIG. 10, an organic light emitting device 1000 according to the third embodiment includes an oxide thin film transistor 1020 arranged on the first substrate 1010 in which a pixel region is defined, an organic light emitting diode 1030 formed on the oxide thin film transistor 1020 and corresponding to the pixel region of the first substrate 1010, a passivation layer 1040 formed on the organic light emitting diode 1030, an adhesive layer 1050 formed on the passivation layer 1040, and a second substrate 1060 formed on the adhesive layer 1050.

Since the organic light emitting device 1000 according to the third embodiment has the oxide thin film transistor 1020 including the first substrate 1010, a gate electrode 1021, a gate insulation layer 1023, an active layer 1025, an etch stopper 1026 and a source/drain electrode 1027, an organic light emitting diode 1030 including a first electrode 1023, a bank 1033, an organic layer 1035, and a second electrode 1037, a passivation layer 1040, and an adhesive layer 1050, which are substantially identical to the oxide thin film transistor 320 including the first substrate 310, the gate electrode 321, the gate insulation film 323, the active layer 325, the etch stopper 326 and the source/drain electrode 327, the organic light emitting diode 330 including a first electrode 323, a bank 333, an organic layer 335 and second electrode 337, the passivation layer 340, and the adhesive layer 350 of the organic light emitting device 300 according to the second embodiment, the detailed description of the organic light emitting device 1000 will be omitted. In this case, a planarization layer 1029 may be substantially identical to the planarization layer 329 of the organic light emitting device 300 according to the second embodiment described with reference to FIG. 3.

A hydrogen capturing layer 1070 made of the metal foil or the metal foil alloy is formed on an inner surface of the second substrate 1060.

In the event, the second substrate 1060 may be a glass substrate, a plastic substrate made of polyethylene terephthalate, polyethylene naphthalate, and polyimide, and a general metal substrate, which are used for a general organic light emitting device, and a metal substrate made of a metal foil or a metal foil alloy, which is used for the organic light emitting device 300 according to the second embodiment described with reference to FIG. 3.

The hydrogen capturing layer 1070 captures and stores residual hydrogen generated from the device in a process of depositing the planarization layer 1029 and the passivation layer 1050, similar to the second substrate 360 made of the metal foil or the metal foil alloy described with reference to FIG. 3, thereby preventing the deoxidization of the active layer 1025 of the oxide thin film transistor 1020. FIGS. 11A to 11D are sectional views illustrating the organic light emitting device in a sequence of processes of fabricating the organic light emitting device according to the third embodiment.

A process of fabricating the organic light emitting device according to the third embodiment may include providing a first substrate 1010 in which a pixel region is defined, forming an oxide thin film transistor 1020 on the first substrate 1010, forming an organic light emitting diode 1030 on the oxide thin film transistor 1020 to correspond to the pixel region of the first substrate 1010, forming a passivation layer 1040 on the organic light emitting diode 1030, forming a hydrogen capturing layer 1070 made of a metal foil or a metal foil alloy including a hydrogen capturing metal on a surface of the second substrate 1060, forming an adhesive layer 1050 on the hydrogen capturing layer 1070, and integrally adhering the adhesive layer 1050 to the passivation layer 1040.

Figure 11A:
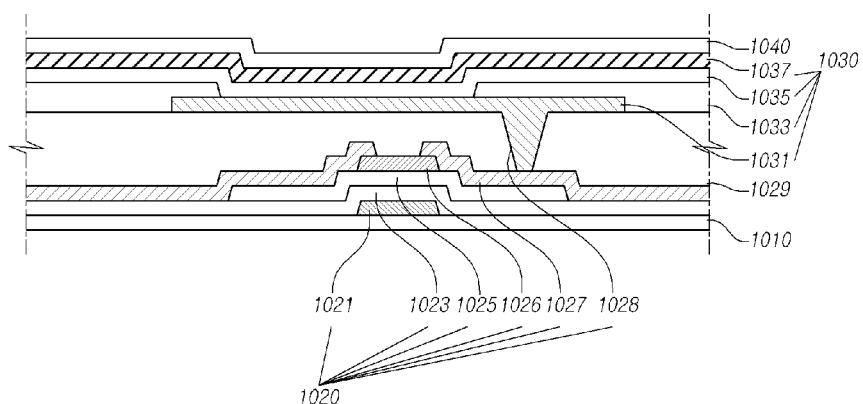
FIGS. 11A to 11D are sectional views illustrating an organic light emitting device in sequence of processes of fabricating the organic light emitting device according to the third exemplary embodiment.
Figure 12:
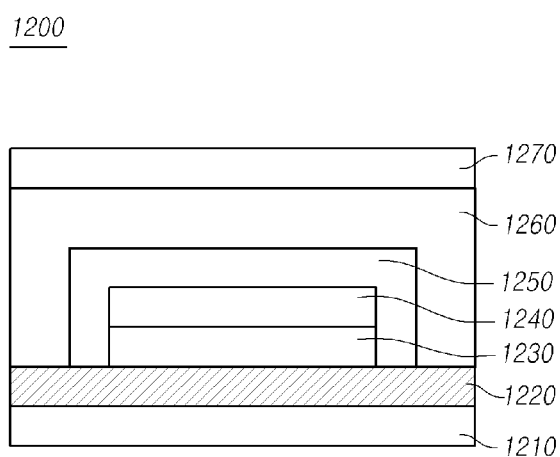
FIG. 12 is a sectional view schematically illustrating an organic light emitting device according to a fourth exemplary embodiment.

Referring to FIG. 11A, the first substrate 1010, the oxide thin film transistor 1020, the organic light emitting diode 1030, and the passivation layer 1040 are sequentially formed.

Figure 11B:
Figure 11C:
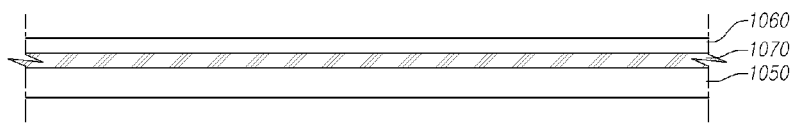

Referring to FIGS. 11B and 11C, then, the adhesive layer 1050, the hydrogen capturing layer 1070, and the second substrate 1060 are formed. In other words, the hydrogen capturing layer 1070 is formed on a surface of the second substrate 1060, and the adhesive layer 1050 is formed on the hydrogen capturing layer 1070.

Further, the hydrogen capturing layer 1070 may be formed on the surface of the second substrate 1060 by a lamination, the chemical vapor deposition, the physical vapor deposition and the like, but a method of forming the hydrogen capturing layer is not limited thereto.

Figure 11D:
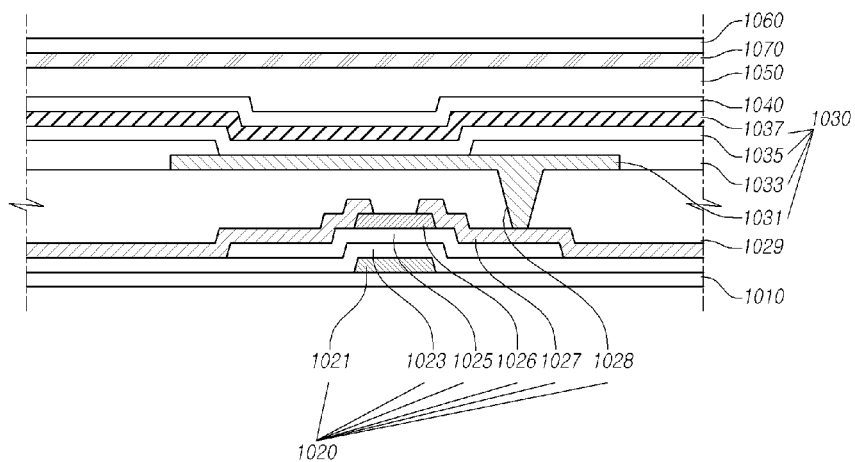

Referring to FIG. 11D, the organic light emitting device 1000 is completed through a step of forming the adhesive layer 1050 to the passivation layer 1040. The adhesive layer 1050 may be formed of a film type adhesive in a face encapsulating manner, but a manner of forming the adhesive layer 1050 is not limited thereto.

An encapsulation structure of the organic light emitting device 1000 according to another aspect may be a hybrid structure in which the passivation layer 1040 and the second substrate 1060 are formed, but is not limited thereto.

In addition to a method of coating the hydrogen capturing layer 1070, bits of a metal foil or a metal foil alloy may be distributed on the passivation layer 1040 or the adhesive layer 1050, thereby removing the residual hydrogen 630.

Further, the method of fabricating the organic light emitting device according to still another aspect has been described which includes forming the hydrogen capturing layer 1070 made of the metal foil or the metal foil alloy including a hydrogen capturing metal on a surface of the second substrate 1060, forming the adhesive layer 1050 on the hydrogen capturing layer 1070, and adhering the adhesive layer 1050 to the passivation layer 1040, but the present invention is not limited thereto. For example, the method of fabricating the organic light emitting device according to this aspect may include forming the adhesive layer 1050 on the passivation layer 1040, and forming a second substrate, which includes the hydrogen capturing layer made of the metal foil or the metal foil alloy including the hydrogen capturing layer based on the metal foil on an inner surface thereof, on the adhesive layer 1050.

The organic light emitting device including the hydrogen capturing layer made of the metal foil or the metal foil alloy on an inner surface of the second substrate 1060 and the method of fabricating the same have been described up to now with reference to FIGS. 10 to 11D. Hereinafter, an organic light emitting device including a first substrate made of a metal foil or a metal foil alloy and a hydrogen capturing layer made of the metal foil or the metal foil alloy on an inner surface of the first substrate and a method of fabricating the same will be described with reference to FIG. 12.

FIG. 12 is a sectional view schematically illustrating an organic light emitting device according to a fourth embodiment.

Referring to FIG. 12, an organic light emitting device 1200 according to the fourth embodiment includes an oxide thin film transistor 1230 arranged on a first substrate 1210 in which a pixel region is defined, an organic light emitting diode 1240 formed on the oxide thin film transistor 1230, a passivation layer 1250 formed on the organic light emitting diode 1240, an adhesive layer 1260 formed on the passivation layer 1250, and a second substrate 1270 formed on the adhesive layer 1260.

The first substrate 1210 has a hydrogen capturing layer 1220, which is made of a metal foil or a metal foil alloy including a hydrogen capturing metal based on the metal foil, on an inner surface thereof. The hydrogen capturing layer 1220 is formed on the first substrate 1210, which is to implement a top emission type of the organic light emitting device 1200.

The first substrate 1210 may be a glass substrate, a plastic substrate made of polyethylene terephthalate, polyethylene naphthalate, polyimide, or the like. Alternately, the substrate 1210 may be made of metal foil or metal foil alloy for the organic light emitting device 1200 similar to the second embodiment described with reference to FIG. 3. The hydrogen capturing layer 1220 may be coated by lamination, chemical vapor deposition, physical vapor deposition, or the like, but the coating manner is not limited thereto.

In the case of the top emission type organic light emitting device 1200, although it is not shown, the first substrate 1210 may be formed of a metal foil or a metal foil alloy including a hydrogen capturing metal. In this event, the hydrogen capturing layer 1220 may not be formed.

Figure 13:
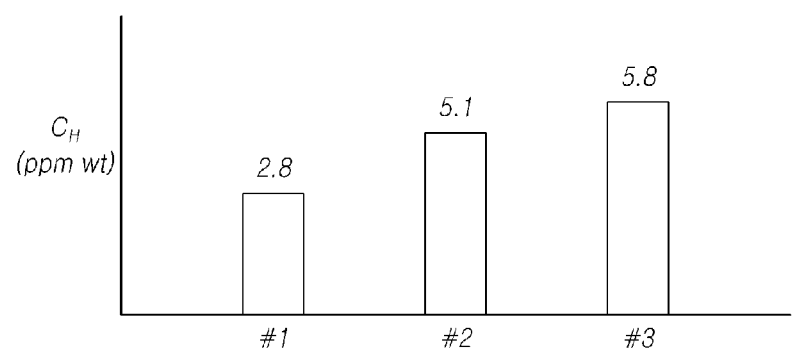
FIG. 13 is a graph illustrating a variation of a content of hydrogen in a second substrate when the organic light emitting device of FIG. 3 including the second substrate is made of a metal foil alloy which is a metal foil based hydrogen capturing metal and includes a hydrogen resolving metal, e.g., Ni.

FIG. 13 is a graph illustrating a variation of hydrogen content in a second substrate when the organic light emitting device of FIG. 3 including the second substrate is made of a metal foil alloy which is a metal foil based hydrogen capturing metal, e.g., Fe, and includes a hydrogen resolving metal, e.g., Ni.

Referring to FIGS. 3 and 13, the organic light emitting device 300 shown in FIG. 3 was fabricated which include the second substrate 360 made of the metal foil alloy including the hydrogen resolving metal, e.g., Ni, which was a hydrogen capturing metal based on metal foil, e.g., Fe.

A content of hydrogen ($C_H$) in the second substrate 360 was 2.8 ppm before the second substrate 360 was adhered to the organic light emitting device 300 (#1). However, after the adhesive layer 350 was formed of a thermoset adhesive and is cured through a curing process at a temperature of 100° C. for three hours (#2), the content of the hydrogen ($C_H$) in the second substrate 360 increased to 5.1 ppm. After an acceleration test was performed at a temperature of 85° C. for one thousand hours (#3), the content of the hydrogen ($C_H$) in the second substrate 360 further increased up to 5.8 ppm.

The increase of the content of the hydrogen ($C_H$) in the second substrate 360 indicates that residual hydrogen 630 in the organic light emitting device 300 was captured in the second substrate 360, and formed the interstitial solid solution or the metal hydride.

In another aspect, the organic light emitting device shown in FIG. 3 was fabricated except that a general glass substrate was used as the second substrate 360. The passivation layer 340 had a thickness of about 0.5 μm, and white bright spots were observed in several places of the organic light emitting device when 85~850 hours lapsed. The bright spots occurred when a defect was generated in the oxide thin film transistor 320 as the residual hydrogen deoxidized the oxide of the active layer 325 of the oxide thin film transistor 320.

As described above, in the case that the organic light emitting device 300 shown in FIG. 3 was fabricated which included the second substrate 360 which was the hydrogen capturing metal based on the metal foil, e.g., Fe, and included the hydrogen resolving metal, e.g., Ni, the passivation layer 340 had a thickness of about 0.5 μm and a bright spot was not observed in the organic light emitting device although one thousand hours lapsed when 85~1000 hours lapsed. Similarly, in the case that the organic light emitting device 1000 shown in FIG. 10 was fabricated in which the hydrogen capturing layer made of the metal foil alloy which was the hydrogen capturing metal based on the metal foil, e.g., Fe, and included the hydrogen resolving metal, e.g., Ni, was formed on the glass substrate as the second substrate, or that the organic light emitting device 1200 shown in FIG. 12 was fabricated in which the hydrogen capturing metal made of the metal foil alloy which was the hydrogen capturing metal based on the metal foil, e.g., Fe, and included the hydrogen resolving metal, e.g., Ni, was formed on the glass substrate as the first substrate, no bright spot was observed in the organic light emitting device although a time lapsed.

The reason for that is because defects of the oxide thin film transistor were prevented because the hydrogen capturing layer formed on the second substrate or the first substrate captured and stored the diffusible hydrogen and the non-diffusible hydrogen.

According to the embodiments of the present invention as described above, in the case that the first substrate or the second substrate is formed of the metal foil or the metal foil alloy including the hydrogen capturing metal, or that the hydrogen capturing layer is coated on an inner surface of the first substrate or the second substrate, the hydrogen capturing layer effectively captures the residual hydrogen generated in the organic light emitting device, thereby preventing the residual hydrogen from being diffused into the light emitting layer or the oxide thin film transistor. Further, it is possible to prevent the variation of an electric behavior of the oxide thin film transistor and the occurrence of the threshold voltage shift, thereby improving reliability and quality of the organic light emitting display.

Although various embodiments have been described up to now with reference to the accompanying drawings, the present invention is not limited to them.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. A term ordinarily used like that defined by a dictionary shall be construed that it has a meaning equal to that in the context of a related description, and shall not be construed in an ideal or excessively formal meaning unless it is clearly defined in the present specification.

Although the embodiments of the present invention have been described for illustrative purposes, those skilled in the art will appreciate that various modifications, additions and substitutions are possible, without departing from the scope and spirit of the invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:
1. An organic light emitting device comprising:
a first substrate;
an oxide thin film transistor on the first substrate;
a planarization layer on the oxide thin film transistor;
an organic light emitting diode on the planarization layer;
a passivation layer on the organic light emitting diode; and
a second substrate on the passivation layer;
wherein both the first and second substrates comprise a hydrogen capturing metal capable of dissociating hydrogen molecules into hydrogen atoms, and preventing deoxidation of materials forming the oxide thin film transistor, and wherein the second substrate comprises a metal foil or a metal foil alloy comprising the hydrogen capturing metal.

2. The organic light emitting device of claim 1, wherein the oxide thin film transistor includes an oxide layer selected from the group consisting of Indium Gallium Zinc Oxide (IGZO), Zinc Tin Oxide (ZTO), and Zinc Indium Oxide (ZIO).

3. The organic light emitting device of claim 1, wherein at least one of the first and the second substrates includes a material selected from the group consisting of Li, Na, Cr, α-Fe, Mo, W, and K.

4. The organic light emitting device of claim 1, wherein at least one of the first and the second substrates includes a material selected from the group consisting of Pt, Pb, Ni, γ-Fe, Cu, Al, Au, and Ag.

5. The organic light emitting device of claim 1, wherein the first substrate comprises a metal foil or metal foil alloy including the hydrogen capturing metal.

6. The organic light emitting device of claim 1, wherein the hydrogen capturing metal is capable of dissociating a hydrogen molecule into hydrogen atoms to form an interstitial solid solution or metal hydride.

7. The organic light emitting device of claim 1, wherein the hydrogen capturing metal includes a metal foil or metal foil alloy formed on an inner surface of one of the first and the second substrates.

8. The organic light emitting device of claim 1, further including an adhesive layer on the passivation layer, wherein the adhesive layer includes an element selected from the group consisting of Ba, Ca, Cu, Fe, Hf, La, Mg, Nb, Ni, Pd, Pt, Se, Sr, Ta, Ti, V, and Zr.

9. The organic light emitting device of claim 1, wherein the hydrogen capturing material includes an element selected from the group consisting of Ba, Ca, Cu, Fe, Hf, La, Mg, Nb, Ni, Pd, Pt, Se, Sr, Ta, Ti, V, and Zr.

* * * * *